United States Patent [19]
Akimoto

[11] Patent Number: 6,126,338
[45] Date of Patent: Oct. 3, 2000

[54] RESIST COATING-DEVELOPING SYSTEM

[75] Inventor: Masami Akimoto, Kumamoto, Japan

[73] Assignee: Tokyo Electron Limited, Tokyo, Japan

[21] Appl. No.: 09/243,117

[22] Filed: Feb. 3, 1999

[30] Foreign Application Priority Data

Feb. 6, 1998 [JP] Japan .................................. 10-039789

[51] Int. Cl.[7] .............................. G03D 5/00; B65G 49/07
[52] U.S. Cl. .......................... 396/611; 396/627; 414/935; 414/937
[58] Field of Search ..................... 396/611, 612, 396/627, 604; 414/152, 225, 935, 936, 937, 938, 939, 940, 941; 355/27; 118/52, 56, 58, 66

[56] References Cited

U.S. PATENT DOCUMENTS

| | | | |
|---|---|---|---|
| 4,985,722 | 1/1991 | Ushijima et al. | 396/627 |
| 5,339,128 | 8/1994 | Tateyama et al. | 396/611 |
| 5,639,301 | 6/1997 | Sasada et al. | 118/52 |
| 5,664,254 | 9/1997 | Ohkura et al. | 396/612 |
| 5,844,662 | 12/1998 | Akimoto et al. | |

*Primary Examiner*—Alan A. Mathews
*Attorney, Agent, or Firm*—Oblon, Spivak, McClelland, Maier & Neustadt, P.C.

[57] ABSTRACT

A resist coating-developing system includes two transporting devices each for transporting a substrate, a relay section arranged between the two transporting devices for temporarily retaining a substrate thereon, a coating unit to and from which a substrate is transferred by one of the two transporting devices, the coating unit subjecting the substrate transferred thereto to a resist coating process, and a developing unit to and from which a substrate is transferred by the other of the two transporting devices, the developing unit subjecting an exposed resist of the substrate transferred thereto to a developing process, wherein the coating unit and the developing unit are arranged opposite to each other with the two transporting devices and the relay section interposed therebetween.

13 Claims, 8 Drawing Sheets

RESIST COATING-DEVELOPING SYSTEM

BACKGROUND OF THE INVENTION

1. Field of the Invention

The present invention relates to a coating-developing system having a transporting device for transporting substrates to be processed, for example, semiconductor wafers, and a plurality of processing units arranged around the transporting device for subjecting the substrates to a coating process, a developing process, and processes preliminary to and subsequent to these processes.

2. Discussion of the Background

In the process of manufacturing semiconductor devices, for example, a series of processes is performed wherein a substrate to be processed, for example, a semiconductor wafer, is applied with a processing liquid such as a photoresist liquid and a photoresist film thus formed is exposed, for example, to light of reduced circuit pattern by a photolithography technique and then developed. This series of processes is very important for integration of semiconductor devices.

The series of processes includes cleaning a semiconductor wafer in a cleaning unit, subjecting the wafer to a coating with an adhesion promoter in an adhesion unit, then cooling the wafer in a cooling unit, and forming a photoresist film, that is, a photosensitive film, in a resist coating unit. Then, after the photoresist film is heated for baking (prebaking) in a heating unit, the semiconductor wafer is exposed to a predetermined pattern of light in an exposure unit, then applied with a developer in a developing unit to form the predetermined pattern thereon, and subjected to a baking process (postbaking process) to enhance the thermal modification for polymerization as well as the adhesion between the semiconductor wafer and the pattern.

As a system for performing such coating and developing processes, a coating-developing system is known in which various processing units mentioned above are vertically arranged one upon another around a transportation path extending in the vertical direction and semiconductor wafers are transported to and from the individual processing units by a transfer mechanism vertically movable along the transportation path (cf. U.S. Pat. No. 5,664,254).

In this type of system, the cleaning unit, the adhesion unit, the baking unit, etc. are placed one upon another to form one processing section, and the resist coating unit and the developing unit are placed one upon the other to form another processing section.

In the aforementioned coating and developing processes, the surface of a semiconductor wafer is subjected to the adhesion process before a resist liquid is applied to the surface of the semiconductor wafer, as described above, and an amine solvent is used in the adhesion process, with the result that alkaline components such as amines are produced. An amine solvent is also used as a solvent for an anti-reflection coating film which is a coating used in the exposure process to prevent abnormal exposure, similarly producing alkaline components such as amines.

If, in the above-described type of coating-developing system, alkaline components such as amines are produced in the adhesion process or the coating process, they may possibly flow into the developing unit because the resist coating unit and the developing unit constituting one processing section are placed one upon the other.

Where highly integrated devices are to be manufactured, such alkaline components flowing into the developing unit make it difficult to form circuit patterns with accurate line widths during the developing process, possibly lowering the yield of IC devices.

BRIEF SUMMARY OF THE INVENTION

An object of the present invention is to provide a resist coating-developing system capable of forming circuit patterns with accurate line widths and improving the yield even in the case where highly integrated devices are to be manufactured.

According to a first aspect of the present invention, there is provided a resist coating-developing system for performing a resist coating process on a substrate and for performing a developing process on a resist after the resist is exposed to light, comprising: a transporting device for transporting a substrate; a coating unit for subjecting the substrate to a resist coating process; a developing unit for subjecting a resist to a developing process after the resist is exposed to light; and a plurality of pre- and post-processing units for performing respective processes preliminary to and subsequent to the resist coating process and the developing process, wherein the coating unit, the developing unit, and the pre- and post-processing units are arranged around the transporting device such that the coating unit and the developing unit are located opposite to each other with the transporting device interposed therebetween.

According to a second aspect of the present invention, there is provided a resist coating-developing system for performing a resist coating process on a substrate and for performing a developing process on a resist after the resist is exposed to light, comprising: a transporting device for transporting a substrate in a vertical direction; a plurality of pre- and post-processing units arranged one upon another in the vertical direction around the transporting device, for subjecting the substrate transported by the transporting device to respective processes preliminary to and subsequent to a resist coating process and a developing process; a coating unit arranged on one side of the transporting device, for performing the resist coating process on the substrate transported by the transporting device; and a developing unit arranged on the other side of the transporting device opposite the coating unit, for performing the developing process on the substrate transported by the transporting device.

According to a third aspect of the present invention, there is provided a resist coating-developing system comprising: two transporting devices each for transporting a substrate; a relay section arranged between the two transporting devices, for temporarily retaining a substrate thereon; a coating unit to and from which a substrate is transferred by one of the two transporting devices, the coating unit subjecting the substrate transferred thereto to a resist coating process; and a developing unit to and from which a substrate is transferred by the other of the two transporting devices, the developing unit subjecting an exposed resist of the substrate transferred thereto to a developing process, wherein the coating unit and the developing unit are arranged opposite to each other with the two transporting devices and the relay section interposed therebetween.

In the resist coating-developing system according to the first aspect of the present invention, the resist coating unit, the developing unit and the pre- and post-processing units are arranged around the transporting device for transporting substrates in such a manner that the coating unit and the developing unit are located opposite to each other with the transporting device interposed therebetween. Consequently, the coating unit is separated from the developing unit, and alkaline components such as amines, if produced in the coating unit, can be prevented without fail from flowing into the developing unit. Even in cases where highly integrated devices are to be manufactured, therefore, circuit patterns with accurate line widths can be formed and the yield of devices can be improved.

In the resist coating-developing system according to the second aspect of the present invention, the pre- and post-processing units for subjecting a substrate to respective processes preliminary to and subsequent to the resist coating process and the developing process are arranged one upon another in the vertical direction around the transporting device for transporting substrates in the vertical direction, and the coating unit for performing the resist coating process on the substrate is arranged on one side of the transporting device while the developing unit for performing the developing process is arranged on the other side of the transporting device opposite the coating unit. It is therefore possible to shorten the transportation path for substrates, permitting the system to be reduced in size, and also the coating unit and the developing unit can be separated from each other as in the system according to the first aspect of the invention.

In the resist coating-developing system according to the third aspect of the present invention, the relay section for temporarily retaining a substrate thereon is arranged between the two transporting devices, and the coating unit and the developing unit are arranged opposite to each other with the two transporting devices and the relay section interposed therebetween. Accordingly, the coating unit and the developing unit can be separated farther from each other, and alkaline components such as amines produced in the coating unit can be prevented without fail from flowing into the developing unit. Further, the use of the two transporting devices and the relay section therebetween makes it possible to process a larger number of substrates, thus improving the throughput.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention, in which.

DETAILED DESCRIPTION OF THE INVENTION

Figure 1:
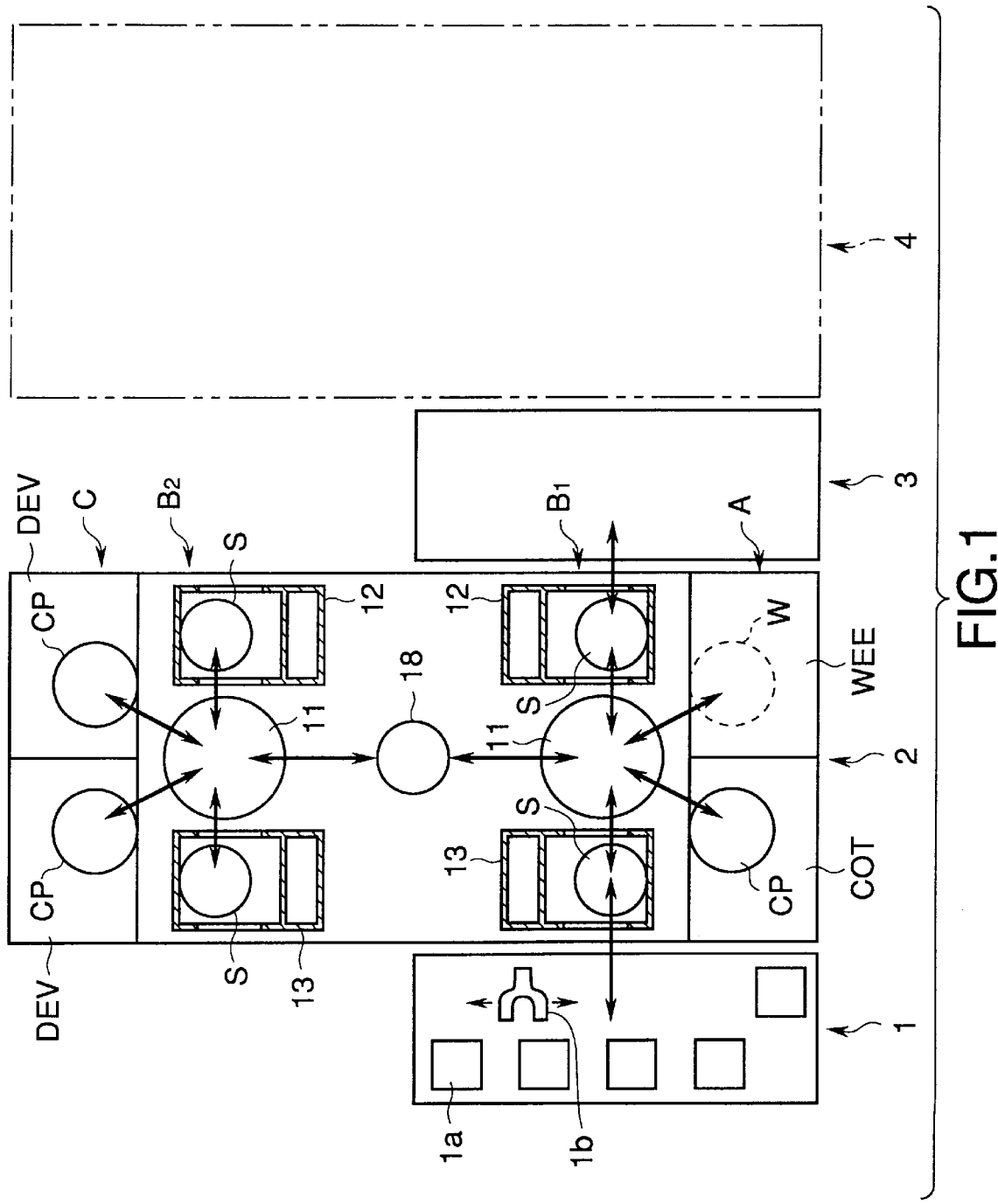
FIG. 1 is a plan view showing the entire arrangement of a resist coating-developing system for semiconductor wafers according to one embodiment of the present invention.
Figure 2:
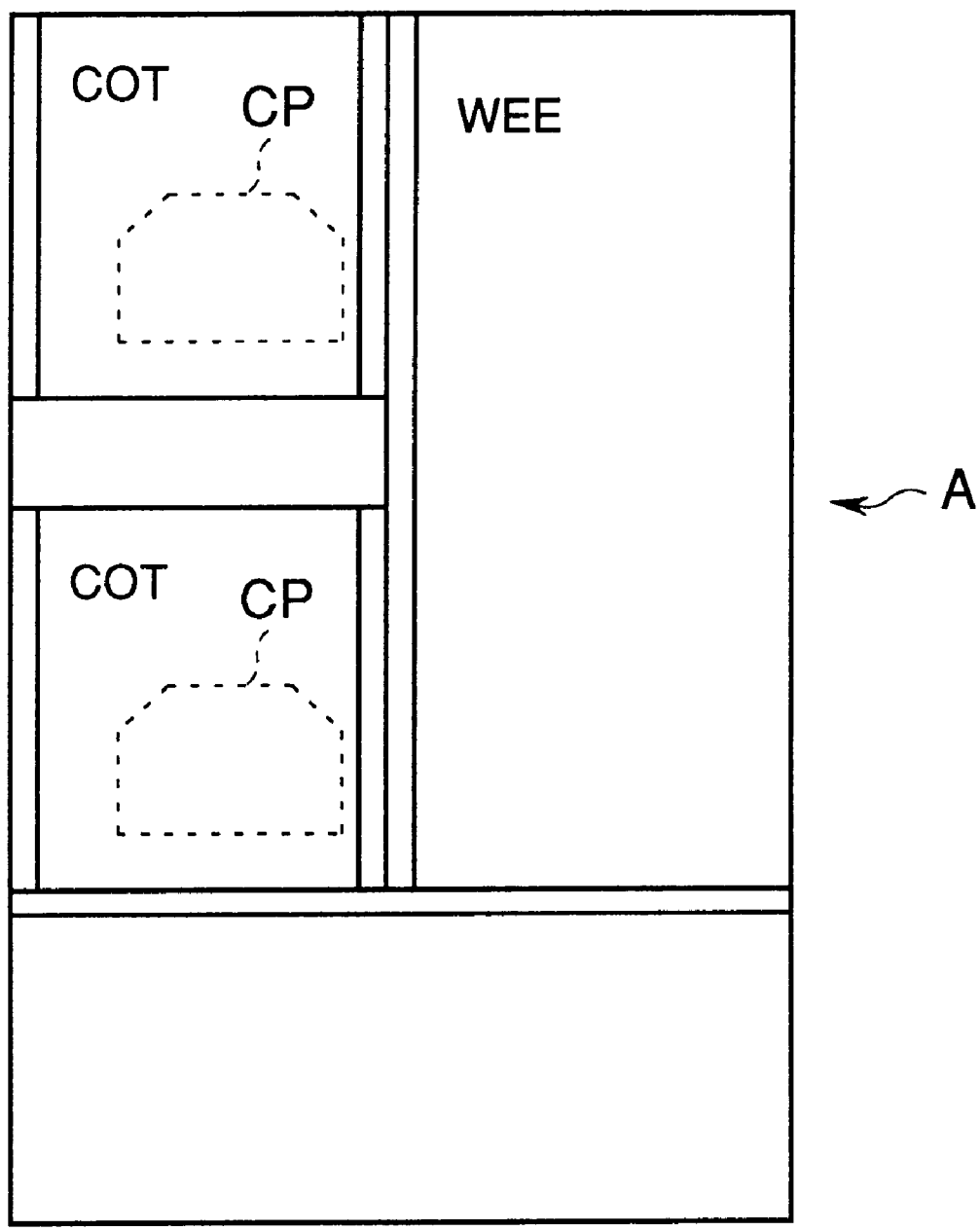
FIG. 2 is a side view of resist coating units and a wafer edge exposure unit of the resist coating-developing system shown in FIG. 1.
Figure 3:
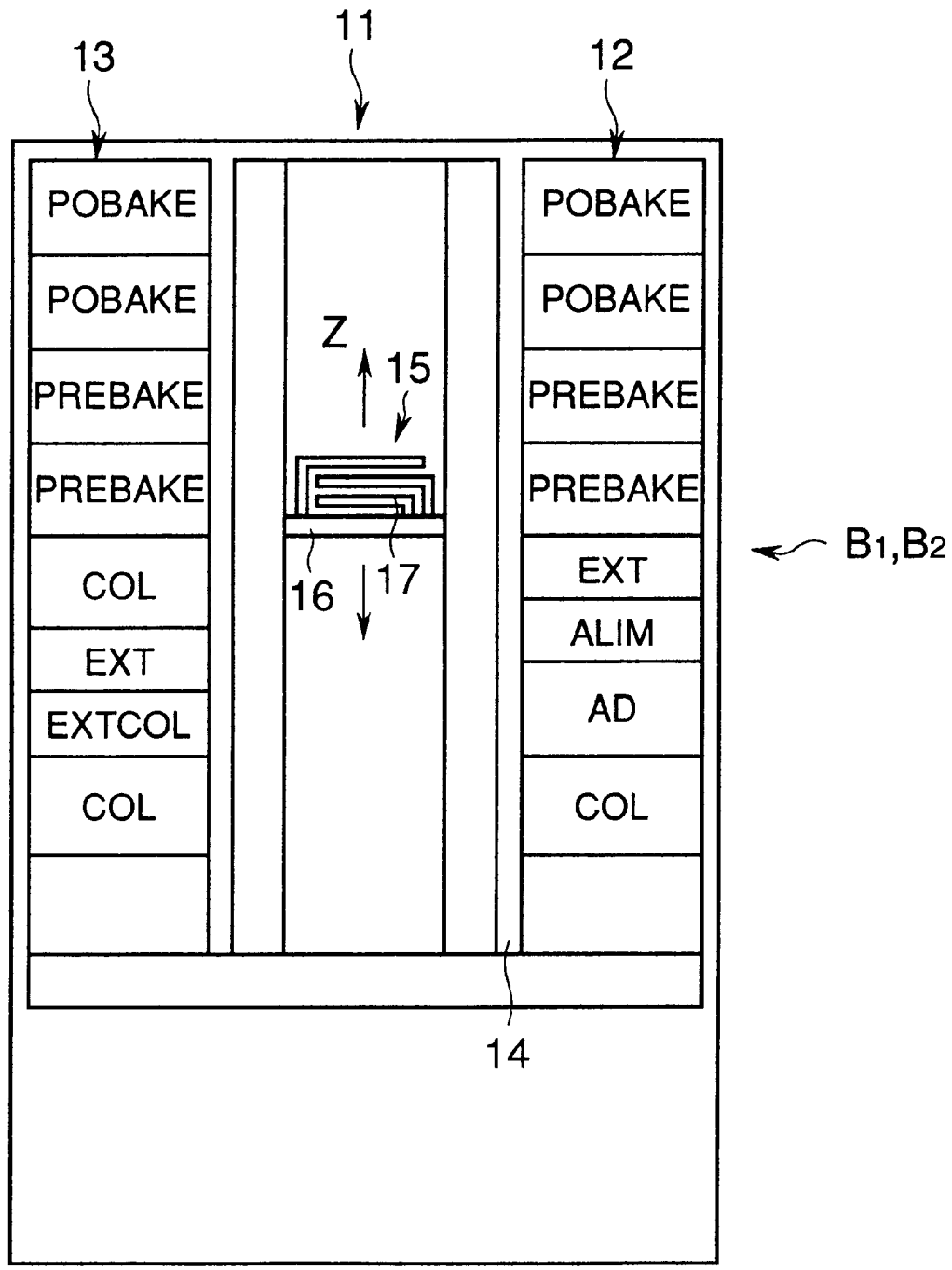
FIG. 3 is a side view of pre- and post-processing units of the resist coating-developing system shown in FIG. 1.
Figure 4:
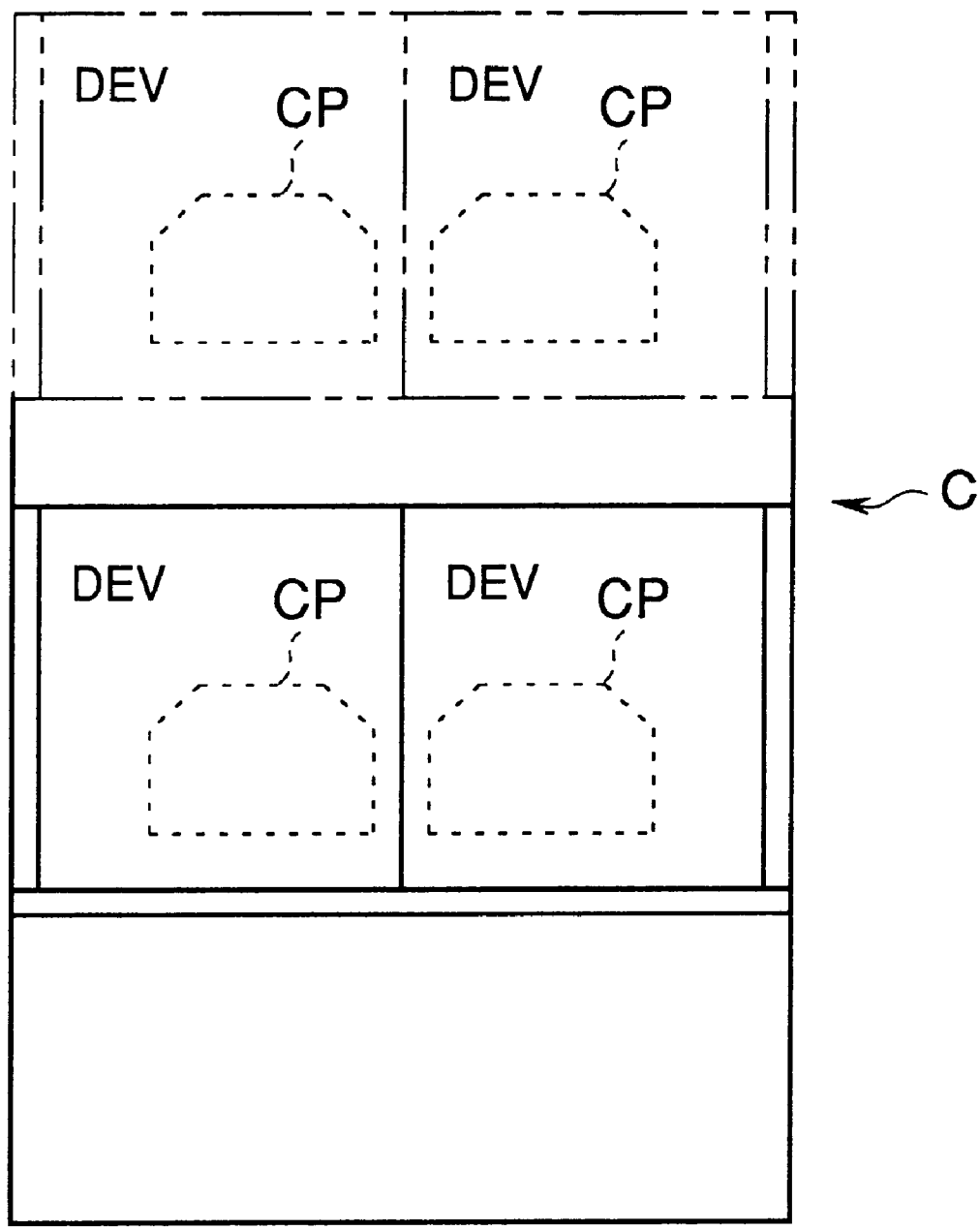
FIG. 4 is a side view of developing units of the resist coating-developing system shown in FIG. 1.

An embodiment of the present invention will be hereinafter described with reference to the drawings. FIG. 1 is a plan view showing the entire arrangement of a resist coating-developing system for semiconductor wafers (hereinafter merely referred to as "wafers") according to one embodiment of the present invention, FIG. 2 is a side view of resist coating units and a wafer edge exposure unit appearing in FIG. 1, FIG. 3 is a side view of pre- and post-processing units appearing in FIG. 1, and FIG. 4 is a side view of developing units appearing in FIG. 1.

As shown in FIG. 1, the resist coating-developing system comprises a cassette station (loader/unloader unit) 1 for loading wafers W as substrates to be processed into the system from outside and for unloading processed wafers W, a processing station 2 including a variety of single-wafer processing units arranged one upon another at respective predetermined positions for performing respective predetermined processes on each of wafers W during resist coating and developing processes, and an interface device 3 arranged adjacent to the processing station 2 for transferring wafers W between the processing station 2 and an exposure unit 4.

The cassette station 1 is a station where wafer cassettes 1a each containing a plurality of, for example, 25 wafers W are transported to the system from outside and vice versa, and also wafers W are loaded into and unloaded from the wafer cassettes 1a by a transporting device 1b, as shown in FIG. 1. The transporting device 1b can also access an alignment unit (ALIM) and an extension unit (EXT) of the processing station 2, as described later.

The processing station 2 basically comprises, as shown in FIG. 1, a first processing section A including resist coating units (COT) for applying resist liquid and a wafer edge exposure unit (WEE), two pairs of second processing sections $B_1$ and $B_2$ for performing processes preliminary to and subsequent to coating and developing processes, and a third processing section C including developing units (DEV) for developing the resist which has been exposed to light.

As shown in FIG. 2, the first processing section A has two resist coating units (COT), which are spinner-type processing units, placed one upon the other for applying resist liquid to a wafer W placed on a spin chuck within a cup CP. The wafer edge exposure unit (WEE) is arranged adjacent to the two, vertically arranged resist coating units (COT). The resist coating units (COT) will be described in detail later.

The two pairs of second processing sections $B_1$ and $B_2$ have substantially the same arrangement, and each pair comprises one transporting device 11 and two stacks 12 and 13 of pre- and post-processing units, as shown in FIGS. 1 and 3.

As shown in FIG. 3, each transporting device 11 comprises a transportation path 14 extending in a vertical direction and a wafer transfer mechanism 15 vertically movable along the transportation path 14 for transferring a wafer W to and from the individual processing units. The wafer transfer mechanism 15 is movable in the vertical direction (Z direction) along the transportation path 14 as well as rotatable in θ direction. The wafer transfer mechanism 15 is also provided with a plurality of pickup members 17 movable back and forth with respect to a base 16, and a wafer W is transferred between the processing units by these pickup members 17. The pickup members 17 can access not only the corresponding stacks 12 and 13 of processing units but also the coating units (COT) and the wafer edge exposure unit (WEE) or the developing units (DEV) nearby.

The two stacks 12 and 13 are made up of similar combinations of pre- and post-processing units each comprising an oven-type processing unit for performing a predetermined process on a wafer W placed on its stage S. Specifically, as shown in FIG. 3, the stack 12 comprises, for example, eight processing units placed one upon another; that is, a cooling unit (COL) for performing a cooling process, an adhesion unit (AD) for performing a hydrophobic process to enhance the adhesion of the resist, an alignment unit (ALIM) for positioning, an extension unit (EXT) for letting in and out a wafer W, two prebaking units (PREBAKE) for performing a heating process preliminary to an exposure process, and two postbaking units (POBAKE) for performing a heating process after the exposure process. Those processing units are arranged from the bottom upward in the order mentioned. The stack 13 also comprises eight processing units placed one upon another; that is, a cooling unit (COL), an extension-cooling unit (EXTCOL), an extension unit (EXT), another cooling unit (COL), two prebaking units (PREBAKE) and two postbaking units (POBAKE). Those processing units are arranged from the bottom upward in the order mentioned.

Thus, the cooling units (COL) and the extension-cooling unit (EXTCOL), of which the processing temperature is low, are arranged at a lower level while the prebaking units (PREBAKE), the postbaking units (POBAKE) and the adhesion unit (AD), of which the processing temperature is high, are arranged at a higher level, whereby thermal interference between the units can be lessened. The processing units may of course be randomly arranged one upon another.

As shown in FIG. 4, the third processing section C comprises two developing units (DEV) arranged adjacent to each other, which units are each a spinner-type processing unit for performing a developing process on a wafer W placed on a spin chuck within a cup CP. Also, two additional developing units (DEV) may be placed on the respective developing units, as indicated by the imaginary line in FIG. 4.

Figure 5:
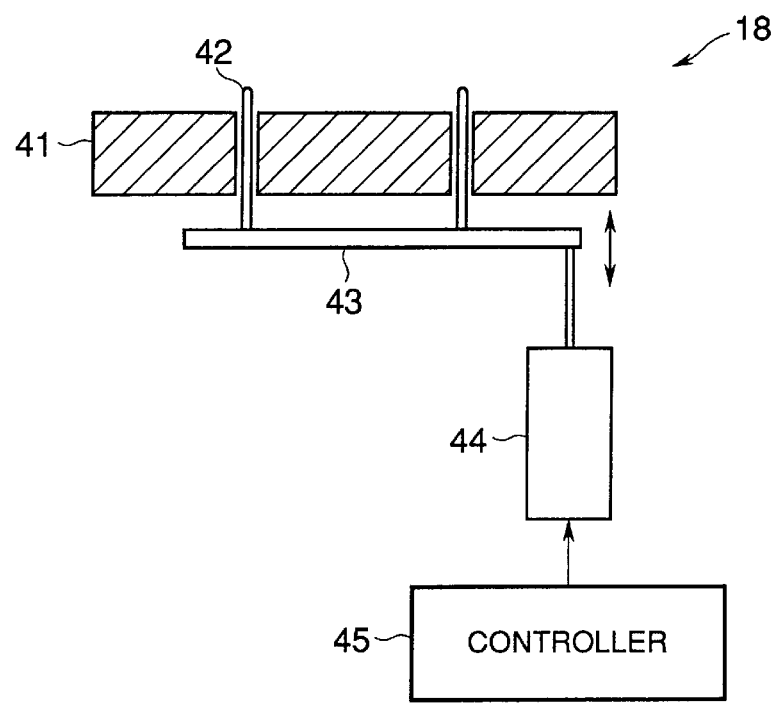
FIG. 5 is a sectional view showing the structure of a relay section.

A relay section 18 for relaying wafers W is provided between the two pairs of second processing sections $B_1$ and $B_2$. A wafer W is temporarily placed on the relay section 18 by one of the transporting devices 11 and then received by the other transporting device 11 when a wafer W which has been subjected to the exposure process is to be transported to a developing unit (DEV) of the third processing section C or when a wafer W which has been subjected to the developing process is to be returned to the cassette station 1, for example. Namely, the relay section 18 serves to relay a wafer W between the two transporting devices 11. The relay section 18 comprises, as shown in FIG. 5, a stage 41 for placing a wafer W thereon, a plurality of lift pins 42 capable of projecting from and retracting into the stage 41, a supporting member 43 supporting the lift pins 42, and a cylinder 44 for moving up and down the lift pins via the supporting member 43. The lift pins 42 are projected when a wafer W is transferred to or from one of the transporting devices 11, and are retracted into the stage 41 to place the wafer W on the stage 41. Up-and-down movement of the lift pins 42 caused by the cylinder 44 is controlled by a controller 45. Specifically, the operation of the cylinder 44 is controlled by the controller 45 such that the lift pins 42 are lifted when at least one of the two transporting devices 11 approaches the relay section 18 and are lowered when the transporting device 11 has moved away from the relay section 18 after placing a wafer W on the lift pins 42.

Figure 6:
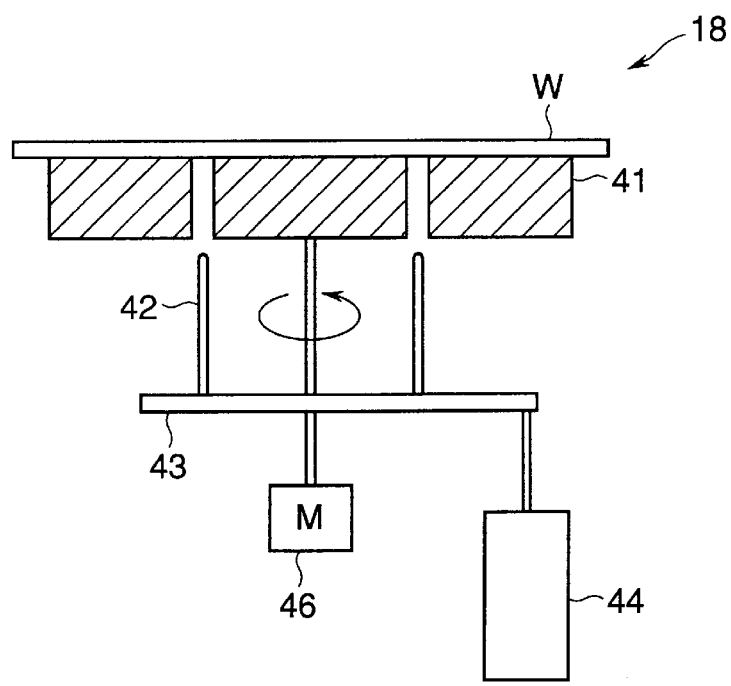
FIG. 6 is a sectional view showing another example of the relay section having a rotatable stage.

The relay section 18 may alternatively be constructed as shown in FIG. 6 such that while a wafer W is placed on the stage 41, the stage 41 can be rotated by a motor 46 with the distal ends of the lift pins 42 positioned at a lower level than the stage 41. The coating units (COT) and the developing units (DEV) are arranged symmetrically with respect to the relay section 18 as shown in FIG. 1, and therefore, by rotating the stage 41 by the motor 46 by 180 degrees, for example, it is possible to change the orientation of the wafer W such that a notch thereof is directed in the right direction.

Figure 7A:
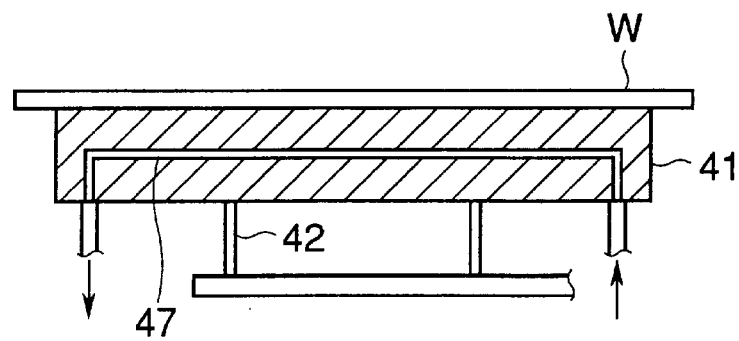
FIG. 7A is a sectional view showing still another example of the relay section provided with a stage having a flow passage for a temperature control medium.
Figure 7B:
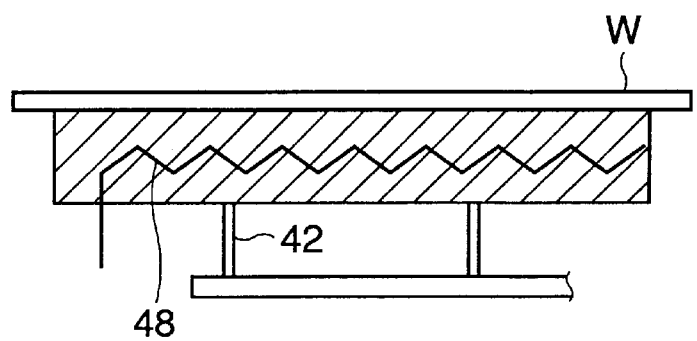
FIG. 7B is a sectional view showing yet another example of the relay section provided with a stage having a heater.

Also, the relay section 18 may be provided with a flow passage 47 extending through the stage 41 for passing a temperature control medium therethrough as shown in FIG. 7A, or be provided with a heater 48 embedded in the stage as shown in FIG. 7B, so that the temperature of the wafer W temporarily placed on the relay section 18 can be controlled to a desired temperature.

Figure 8:
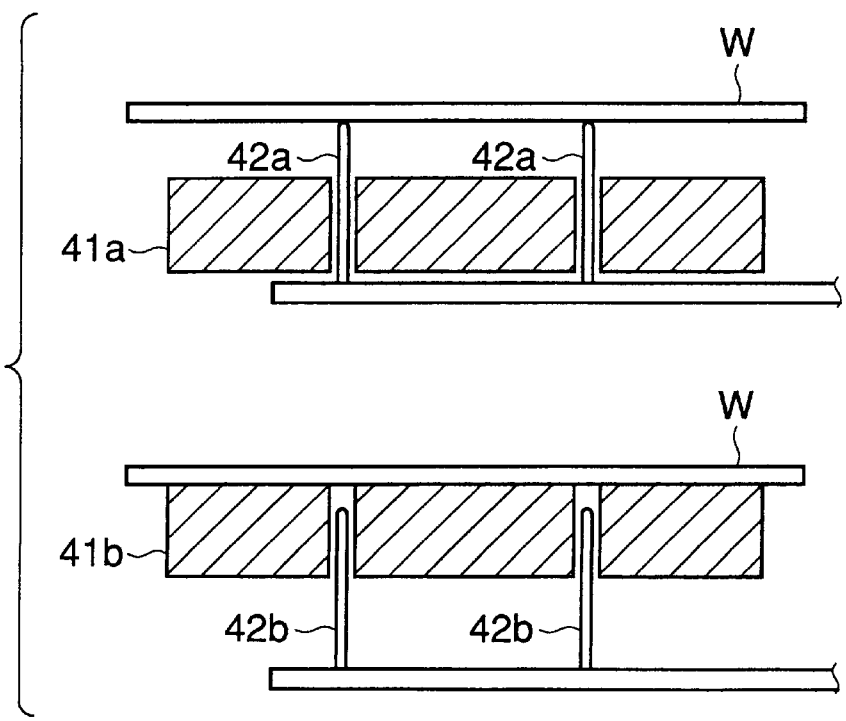
FIG. 8 is a sectional view showing a further example of the relay section having two stages.

Further, as shown in FIG. 8, the relay section 18 may be provided with two stages 41a and 41b arranged up and down. In this case, the stages 41a and 41b are associated with lift pins 42a and 42b, respectively, which are moved up and down independently by respective different cylinders to transfer wafers W to and from the transporting devices 11. Thus, while a wafer W is transferred to or from one stage, the other stage can retain another wafer W thereon, and this permits wafers to be quickly transported and improves the throughput of processing. In this arrangement, at least one of the stages may be provided with the flow passage 47 for a temperature control medium as shown in FIG. 7A or with the heater 48 as shown in FIG. 7B so that the temperature of the wafer W can be controlled. Alternatively, one stage may be provided with the flow passage 47 for a temperature control medium while the other stage with the heater 48 so that the temperatures of the wafers W on these two stages can be kept at different temperatures. The number of stages to be provided is not limited to two and may be three or more.

In cases where a single transporting device is used in common for the sections $B_1$ and $B_2$, the relay section 18 can be omitted.

Space is provided near the relay section 18 between the two pairs of second processing sections $B_1$ and $B_2$ to facilitate entry of the operator for maintenance work, thereby improving the maintainability.

Thus, in this embodiment, the pair of coating units (COT) and the pair of developing units (DEV) are separated at a large distance from each other by the two transporting devices 11 and the relay section 18, and accordingly, even if alkaline components such as amines are produced in the coating units (COT), they are prevented without fail from flowing into the developing units (DEV).

Figure 9:
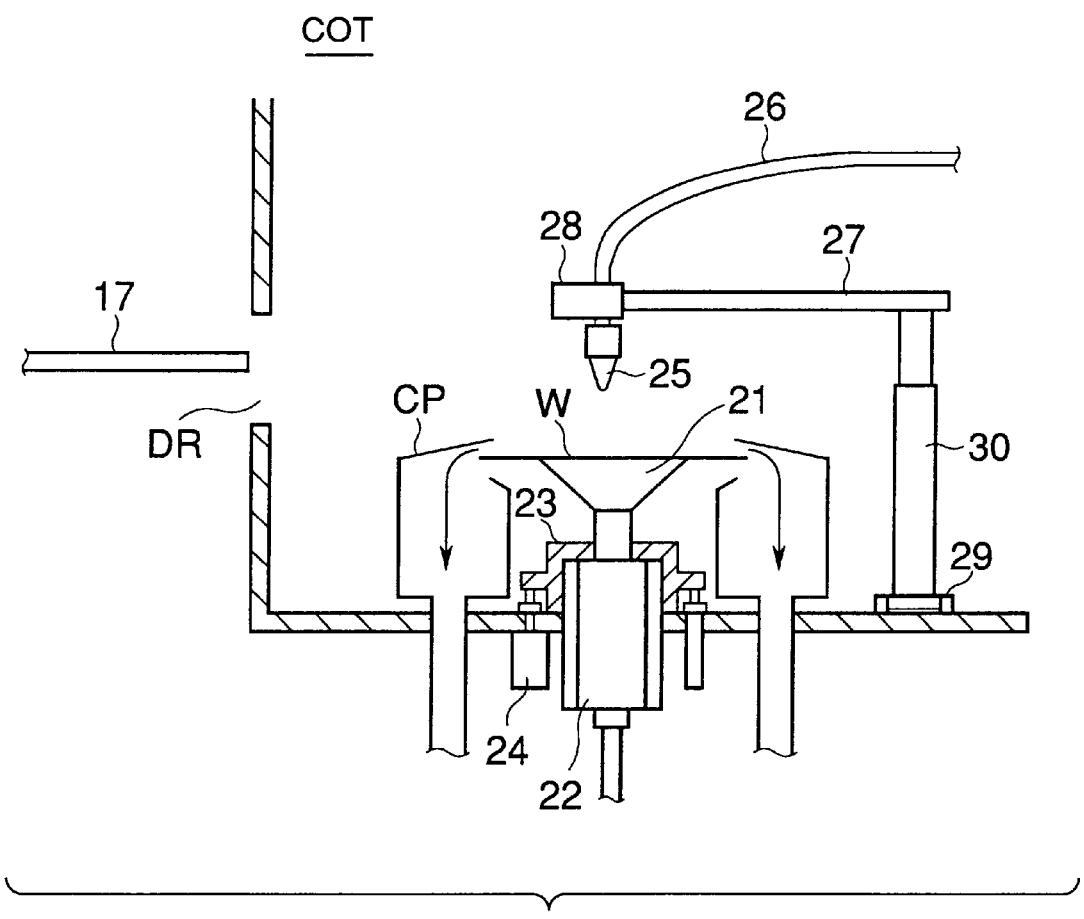
FIG. 9 is a sectional view showing the entire arrangement of a resist coating unit incorporated in the resist coating-developing system shown in FIG. 1.
Figure 10:
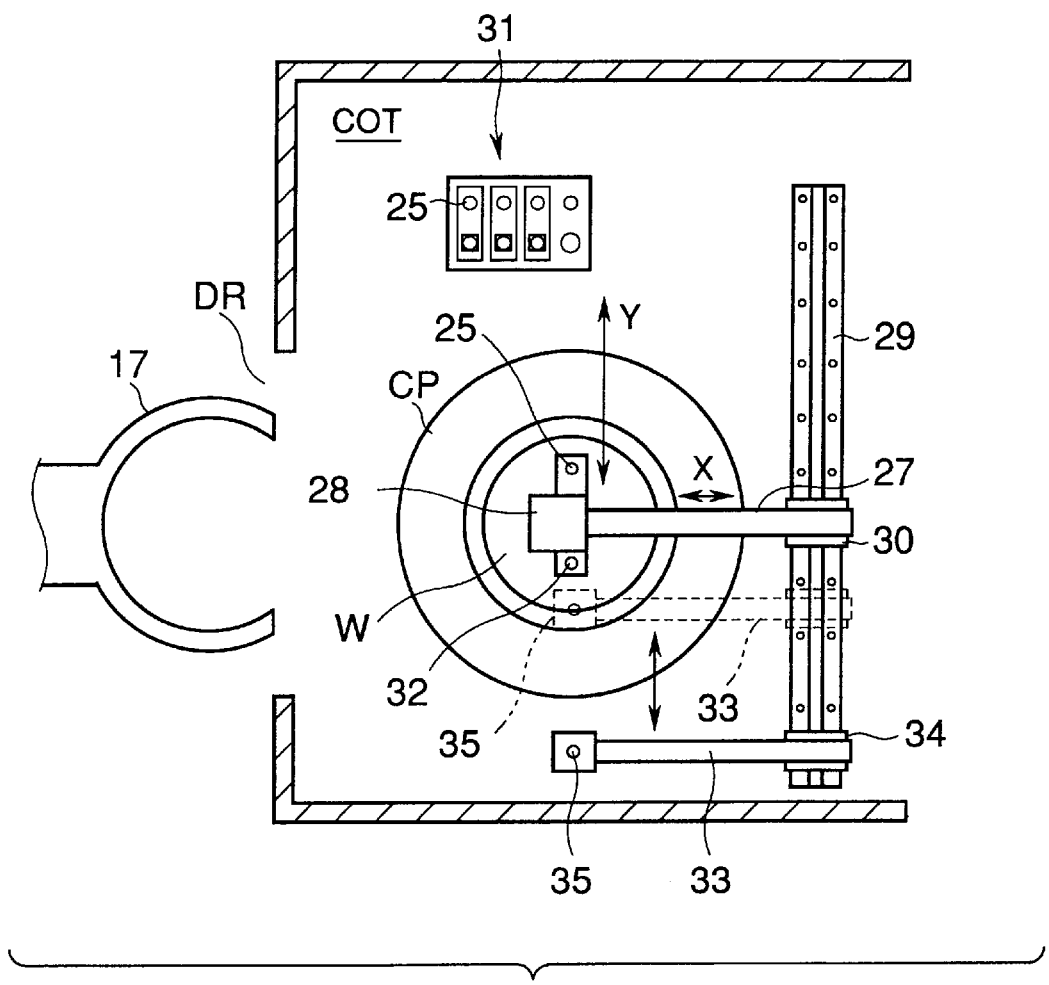
FIG. 10 is a plan view of the resist coating unit shown in FIG. 9.

The resist coating units (COT) incorporated in the coating-developing system of this embodiment will be now described. FIGS. 9 and 10 are a schematic sectional view and a schematic plan view, respectively, showing the entire arrangement of the resist coating unit (COT).

An annular cup CP is arranged at a central portion of the resist coating unit (COT), and a spin chuck 21 is arranged inside the cup CP. The spin chuck 21 is rotated by a drive motor 22 while retaining a wafer W thereon by vacuum suction. The drive motor 22 is fixed to a flange 23 which is moved up and down by an air cylinder 24.

A resist nozzle 25 for supplying a resist liquid to the surface of the wafer W is connected to a resist supply section (not shown) through a resist supply tube 26. The resist nozzle 25 is detachably attached to a distal end of a resist nozzle scan arm 27 by a nozzle holder 28. The resist nozzle scan arm 27 is attached to an upper end of a vertical supporting member 30 which is horizontally movable on a guide rail 29 extending in one direction (Y direction), and can be moved in the Y direction together with the vertical supporting member 30 by a Y-direction actuating mechanism, not shown.

The resist nozzle scan arm 27 can also be moved in an X direction perpendicular to the Y direction by an X-direction actuating mechanism, not shown, so that resist nozzles 25 can be selectively attached to the scan arm 27 at a resist nozzle standby section 31.

Also attached to the distal end of the resist nozzle scan arm 27 is a thinner nozzle 32 which supplies a liquid, for example, a thinner, to the surface of the wafer to wet the wafer preliminary to the supply of the resist liquid to the surface of the wafer.

Further, a vertical supporting member 34 supporting a rinse nozzle scan arm 33 is arranged so as to be movable on the guide rail 29 in the Y direction. A rinse nozzle 35 for side rinsing is attached to a distal end of the rinse nozzle scan arm 33. The rinse nozzle scan arm 33 and the rinse nozzle 35 are capable of translation or linear motion between a rinse nozzle standby position (indicated by the solid line) and a rinsing liquid discharge position (indicated by the dashed line) right above the peripheral portion of the wafer W.

Referring now to FIGS. 1 through 4, the operation and advantages of the coating-developing system for wafers according to this embodiment will be summarized.

A wafer W which has undergone a cleaning process is transported from the cassette station 1 to the extension unit (EXT) in the stack 13 of the second processing section $B_1$, and then is subjected to the hydrophobic process in the adhesion unit (AD) of the same processing section $B_1$, or in the adhesion unit (AD) of the other second processing section $B_2$ after being conveyed via the relay section 18, to enhance the adhesion of the resist.

The wafer W, which has thus been subjected to the hydrophobic process, is conveyed to one of the resist coating units (COT) of the first processing section A by the transporting device 11 to be applied with the resist liquid. In the case of coating the wafer W with an antireflection film, an antireflection film is first formed on the surface of the wafer, then the wafer is baked, and the resist liquid is applied to the wafer.

The wafer W applied with the resist liquid is transported by the transporting device 11 to one of the prebaking units (PREBAKE) for prebaking, and then to the alignment unit (ALIM) in the stack 12 before being conveyed to the interface device 3. Subsequently, the wafer is transported from the interface device 3 to the exposure unit 4 where it is exposed to a reduced pattern of light corresponding to a predetermined circuit pattern.

The thus-exposed wafer W is then returned to the processing station 2 via the interface device 3, and is baked in one of the postbaking units (POBAKE) of the second processing section $B_1$, or in one of the postbaking units (POBAKE) of the other second processing section $B_2$ after being conveyed via the relay section 18. Subsequently, the wafer W is transported by the transporting device 11 to one of the developing units (DEV) for development, and then subjected to postbaking in one of the postbaking units (POBAKE) to strengthen the pattern.

The wafer W which has been processed in this manner is conveyed to the relay section 18 by the transporting device 11 of the second processing section $B_2$, and then returned to the cassette station 1 by the transporting device 11 of the other second processing section $B_1$.

The two transporting devices 11 and the relay section 18 provided in this embodiment permit wafers to be transported with a higher degree of freedom, and therefore, various processes can be performed in the first, second and third processing sections A, $B_1$, $B_2$ and C while wafers W are transported appropriately from one place to another, whereby a large number of wafers W can be processed continuously, making it possible to improve the throughput. Also, since the pair of resist coating units (COT) and the pair of developing units (DEV) are separated at a large distance from each other by the two transporting devices 11 and the relay section 18 as stated above, alkaline components such as amines, if produced in the coating units (COT), can be prevented without fail from flowing into the developing units (DEV). Accordingly, even in cases where highly integrated devices are to be manufactured, circuit patterns with accurate line widths can be formed and the yield of devices can be further improved.

The present invention is not limited to the foregoing embodiment alone and can be modified in various ways. For example, although the description of the above embodiment is directed to the coating unit for applying a resist liquid to semiconductor wafers, the present invention is equally applicable to the case of applying a resist liquid to other types of substrates than semiconductor wafers, such as LCD substrates. Also, a plurality of groups of processing units may be arranged around a single transporting device such that the developing unit and the coating unit are located opposite to each other. Further, the transporting device to be used is not limited to the vertical transportation type which transports substrates to be processed in the vertical direction and may be a horizontal transportation type which transports substrates horizontally in a plane.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A resist coating-developing system comprising:
   two transporting devices each for transporting a substrate;
   a relay section arranged between said two transporting devices, for temporarily retaining a substrate thereon;
   a coating unit to and from which a substrate is transferred by one of said two transporting devices, said coating unit subjecting the substrate transferred thereto to a resist coating process; and
   a developing unit to and from which a substrate is transferred by another of said two transporting devices, said developing unit subjecting an exposed resist of the substrate transferred thereto to a developing process, wherein said coating unit and said developing unit are arranged opposite to each other with said two transporting devices and said relay section interposed therebetween.

2. The resist coating-developing system according to claim 1, wherein said two transporting devices are arranged on opposite sides of said relay section such that said two transporting devices and said relay section are located in line, said coating unit is arranged on one side of said one transporting device opposite said relay section, and said developing unit is arranged on one side of said another transporting device opposite said relay section.

3. The resist coating-developing system according to claim 1, wherein each of said two transporting devices includes a transportation path extending in a vertical direction, and a transfer mechanism for transporting a substrate in the vertical direction along said transportation path and transferring the substrate to and from said coating unit and said developing unit.

4. The resist coating-developing system according to claim 1, wherein a plurality of stacks of pre- and post-processing units vertically arranged one upon another are arranged around said two transporting devices, for subjecting the substrates transported by said transporting devices to respective processes preliminary to and subsequent to the resist coating process and the developing process, said one transporting device, stacks of pre- and post-processing units surrounding said one transporting device and said coating unit constituting a first processing section, said another transporting device, stacks of pre- and post processing units surrounding said another transporting device and said developing unit constituting a second processing section.

5. The resist coating-developing system according to claim 4, wherein one of said first and second processing sections is associated with a loader/unloader unit for containing unprocessed substrates and processed substrates.

6. The resist coating-developing system according to claim 4, wherein one of said first and second processing sections is associated with an interface device for transferring substrates to and from an exposure unit.

7. The resist coating-developing system according to claim 1, wherein said relay section includes a stage for placing a substrate thereon, lift pins capable of projecting from and retracting into said stage, and a lifting mechanism for moving up and down said lift pins, said lift pins being lifted when transferring a substrate and lowered to place the substrate on said stage.

8. The resist coating-developing system according to claim 7, wherein said stage of said relay section includes a plurality of stages each for placing a substrate thereon.

9. The resist coating-developing system according to claim 7, further comprising control means for controlling said lifting mechanism, said control means controlling operation of said lifting mechanism such that said lift pins are lifted when at least one of said two transporting devices approaches said relay section and are lowered when said at least one transporting device has moved away from said relay section after placing a substrate on said lift pins.

10. The resist coating-developing system according to claim 7, wherein said stage includes a temperature control mechanism for controlling temperature of a substrate placed thereon.

11. The resist coating-developing system according to claim 7, wherein said relay section further includes a rotating mechanism for rotating said stage while a substrate is placed on said stage.

12. A resist coating-developing system for coating a resist solution onto a substrate and for developing a resist film on the substrate, comprising:

a transportation path extending in a vertical direction;

a transporting device arranged within said transportation path for transporting the substrate, said transporting device including a holder for holding the substrate, a back-and-forth driving mechanism for driving the holder back and forth, a Z-axis driving mechanism for driving the holder in a Z-axis direction, and a $\theta$ swinging mechanism for swinging the holder about the Z-axis;

a plurality of coating units arranged on a first side of said transportation path for coating a resist solution onto the substrate;

a plurality of developing units arranged on a second side of said transportation path, opposite the first side, for developing a resist film which is exposed to light; and a plurality of pre- and post-processing units for performing a processing prior to resist coating in the coating unit, a processing subsequent to resist coating in the coating unit, a processing prior to developing in the developing unit, and a processing subsequent to developing in the developing unit;

wherein said coating units, said developing units, and said pre- and post-processing units are arranged to surround said transportation path such that said coating units and said developing units are positioned to face each other with said transporting path interposed therebetween.

13. The resist coating-developing system according to claim 12, wherein said plurality of pre- and post-processing units are arranged between the plurality of coating units and the plurality of developing units configured to prevent process atmospheres of the coating unit and the developing unit from interfering with each other.

* * * * *